United States Patent
Chung et al.

(10) Patent No.: US 10,777,639 B2
(45) Date of Patent: Sep. 15, 2020

(54) TWO-DIMENSIONAL SEMICONDUCTOR, MANUFACTURING METHOD THEREFOR, AND SEMICONDUCTOR DEVICE COMPRISING SAME

(71) Applicants: KONKUK UNIVERSITY INDUSTRIAL COOPERATION CORP, Seoul (KR); Korea Advanced Institute of Science and Technology, Daejeon (KR)

(72) Inventors: Hyun Jong Chung, Gyeonggi-do (KR); Hyun Cheol Kim, Seoul (KR); Han Byeol Lee, Gyeonggi-do (KR); Hak Seong Kim, Seoul (KR); Sung Yool Choi, Daejeon (KR)

(73) Assignees: KONKUK UNIVERSITY INDUSTRIAL COOPERATION CORP, Seoul (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/314,676

(22) PCT Filed: Jul. 4, 2016

(86) PCT No.: PCT/KR2016/007171
§ 371 (c)(1),
(2) Date: Jan. 1, 2019

(87) PCT Pub. No.: WO2018/004046
PCT Pub. Date: Jan. 4, 2018

(65) Prior Publication Data
US 2019/0319096 A1   Oct. 17, 2019

(30) Foreign Application Priority Data

Jul. 1, 2016 (KR) .................. 10-2016-0083620

(51) Int. Cl.
*H01L 29/06* (2006.01)
*H01L 29/66* (2006.01)
(Continued)

(52) U.S. Cl.
CPC .... *H01L 29/0684* (2013.01); *H01L 29/66969* (2013.01); *H01L 29/872* (2013.01); *H01L 29/24* (2013.01)

(58) Field of Classification Search
CPC .......... H01L 29/0684; H01L 29/66966; H01L 29/872; H01L 29/24; H01L 29/0665;
(Continued)

(56) References Cited

U.S. PATENT DOCUMENTS 9,285,651 B2 *  3/2016  Chen .................... G02F 1/025
9,595,580 B2     3/2017  Shin et al.
(Continued)

FOREIGN PATENT DOCUMENTS

JP   2016-127267    7/2016
KR   10-2014-0095062   7/2014
(Continued)

OTHER PUBLICATIONS

Hyun-Cheol Kim et al., "Engineering Optical and Electronic Properties of WS2 by Varying the Number of Layers", ACS Nano, Jul. 2015, pp. 1-27.
(Continued)

*Primary Examiner* — Dao H Nguyen
(74) *Attorney, Agent, or Firm* — JCIPRNET

(57) ABSTRACT

Disclosed are a two-dimensional semiconductor in which an energy band gap changes with thickness, a manufacturing method therefor, and a semiconductor device comprising the same. A two-dimensional semiconductor according to an embodiment comprises: a first layer having a first thickness; and a second layer having a second thickness, wherein the
(Continued)

first thickness and the second thickness are different from each other, the first layer forms a first junction with a first electrode, and the second layer forms a second junction with a second electrode.

14 Claims, 7 Drawing Sheets

(51) Int. Cl.
  *H01L 29/872* (2006.01)
  *H01L 29/24* (2006.01)
(58) Field of Classification Search
  CPC ... H01L 29/47; H01L 29/45; H01L 29/66212; H01L 21/285; H01L 21/04; H01L 21/28568
  USPC .............. 257/613, 194, 98, 27, 24, E29.022, 257/E29.04, E29.068, E29.245, E21.334, 257/E21.135, E21.421, E21.561, E33.067, 257/E27.108, E27.159; 385/2, 3, 14; 438/513, 517, 299, 31, 157
  See application file for complete search history.

(56) References Cited

U.S. PATENT DOCUMENTS

| 9,829,727 | B2 * | 11/2017 | Huang ................... G02B 6/122 |
| 2010/0060970 | A1 * | 3/2010 | Chen ....................... G02F 1/025 |
| | | | 359/245 |
| 2012/0007045 | A1 | 1/2012 | Song et al. |
| 2014/0097403 | A1 * | 4/2014 | Heo .................... H01L 29/7391 |
| | | | 257/27 |
| 2014/0197459 | A1 | 7/2014 | Kis et al. |

FOREIGN PATENT DOCUMENTS

| KR | 10-1436849 | 9/2014 |
| KR | 10-2015-0008770 | 1/2015 |
| KR | 10-1505126 | 3/2015 |
| KR | 10-2015-0038579 | 4/2015 |
| KR | 10-2015-0051823 | 5/2015 |

OTHER PUBLICATIONS

"International Search Report (Form PCT/ISA/210)" of PCT/KR2016/007171, dated Apr. 26, 2017, with English translation thereof, pp. 1-4.

* cited by examiner

[FIG. 1]
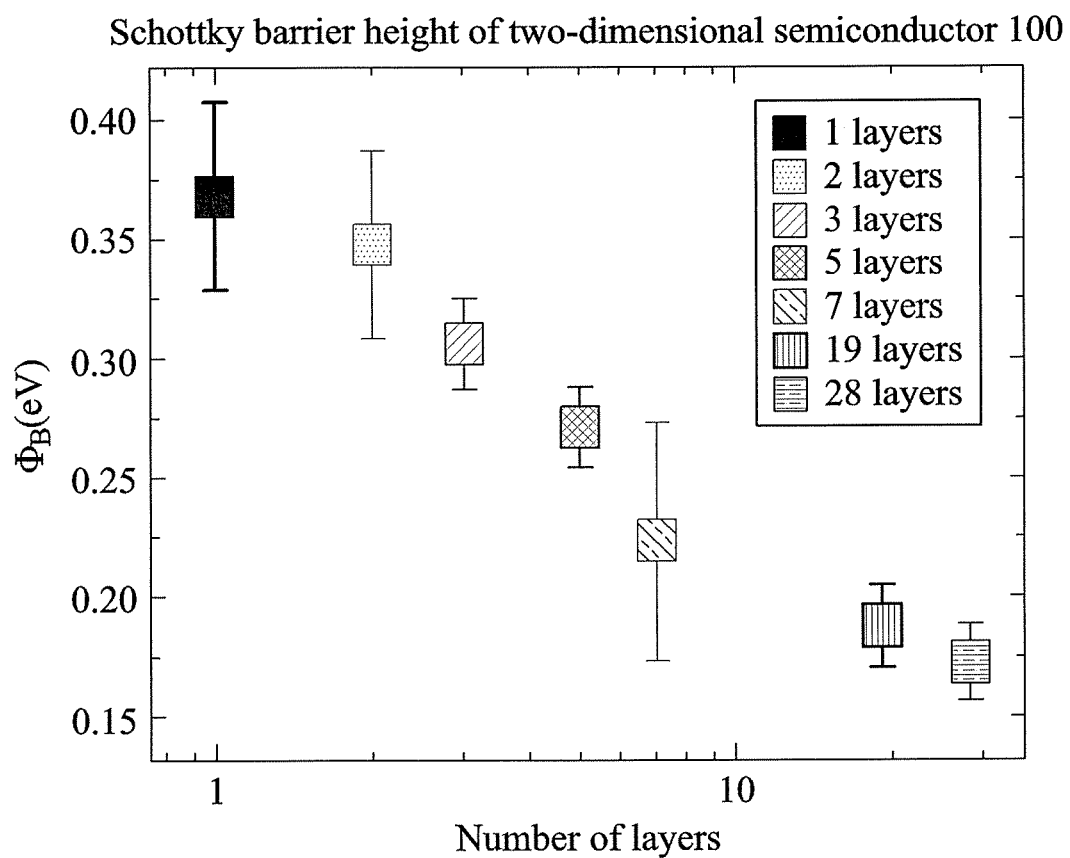

[FIG. 2]
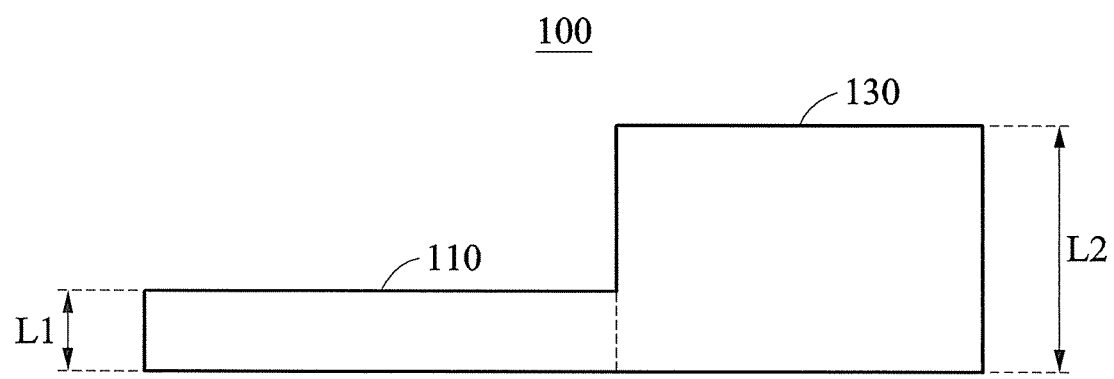

[FIG. 3]
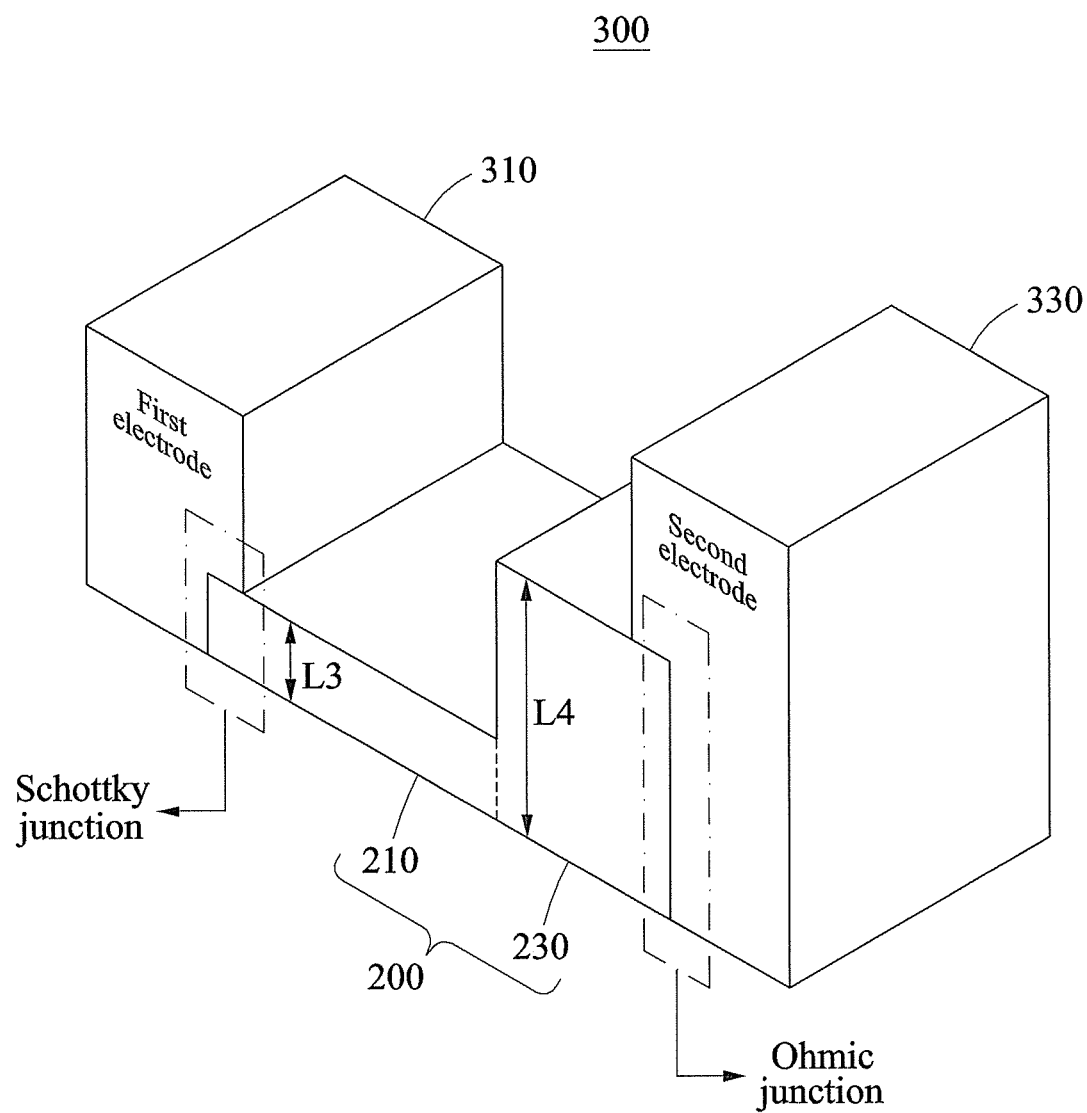

[FIG. 4]
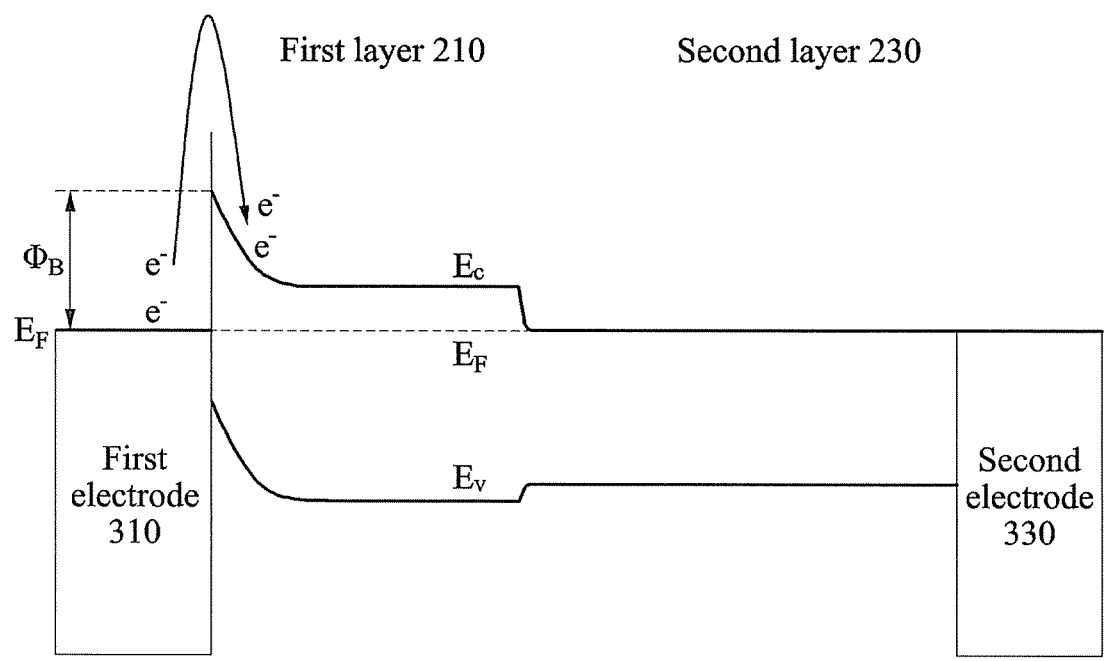

[FIG. 5A]
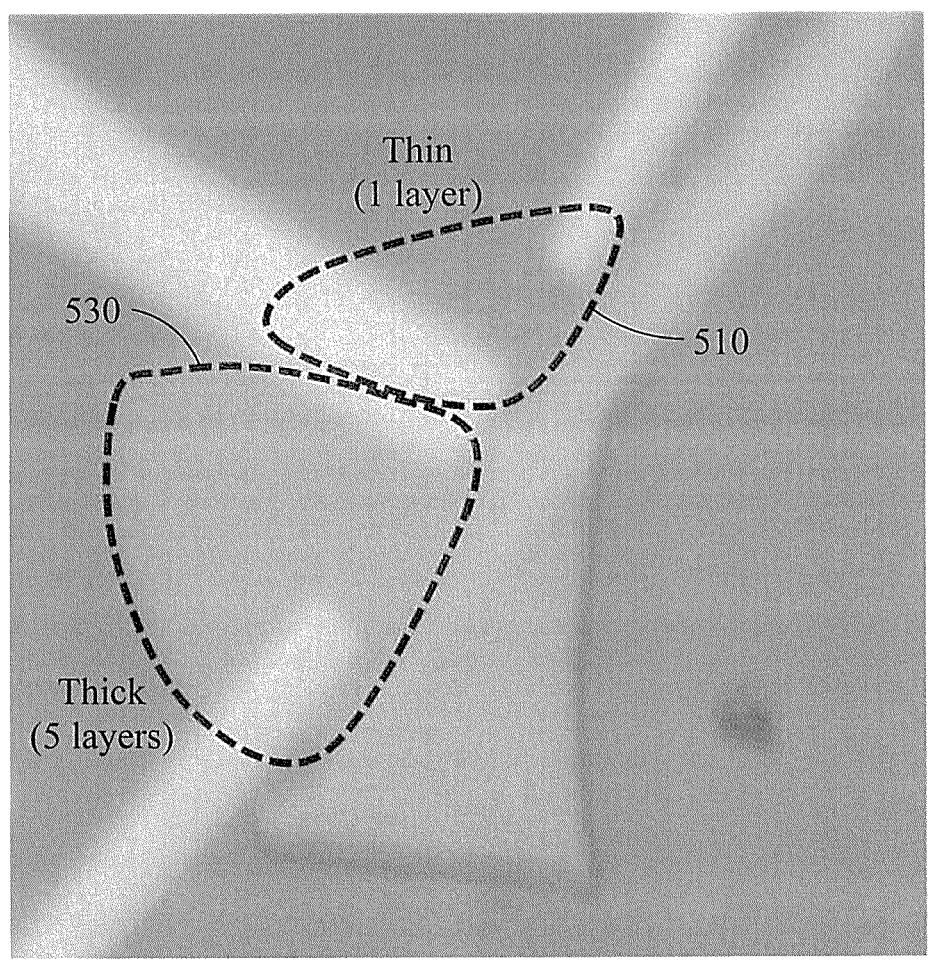

[FIG. 5B]
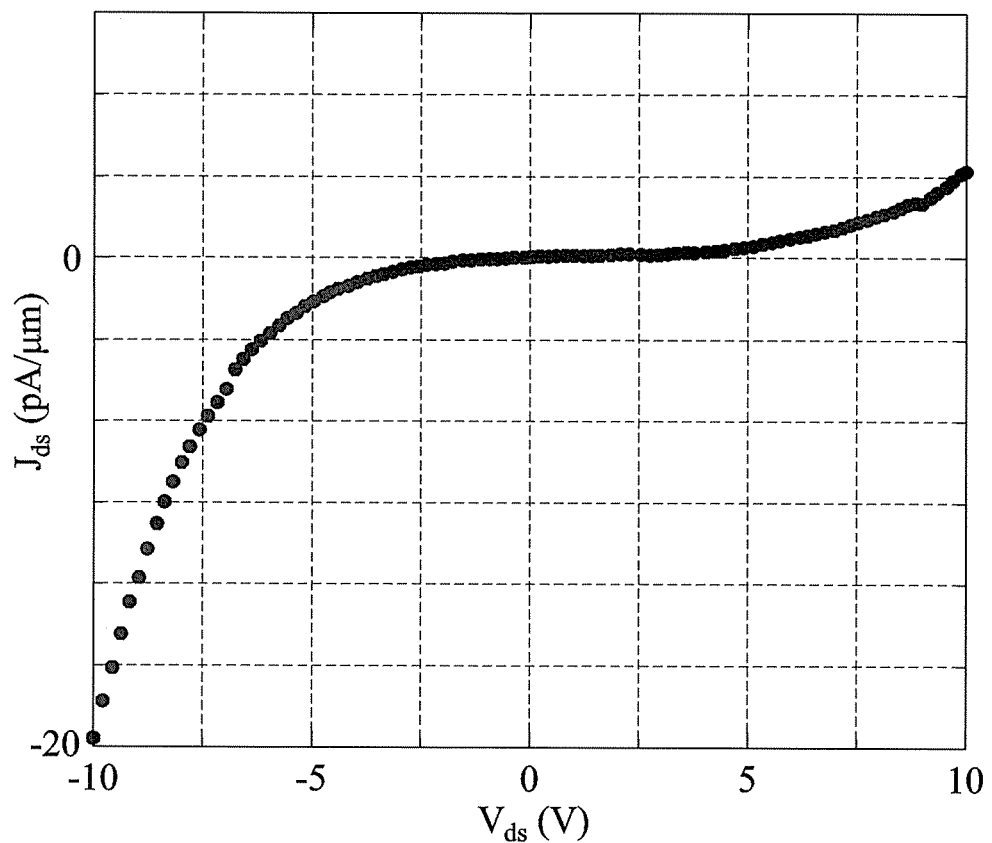

[FIG. 6]
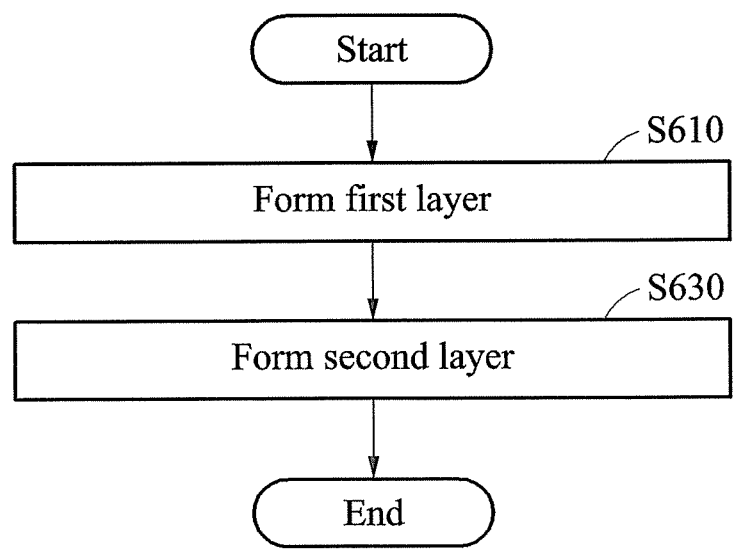

TWO-DIMENSIONAL SEMICONDUCTOR, MANUFACTURING METHOD THEREFOR, AND SEMICONDUCTOR DEVICE COMPRISING SAME

CROSS-REFERENCE TO RELATED APPLICATION

This application is a 371 of international application of PCT application serial no. PCT/KR2016/007171, filed on Jul. 4, 2016, which claims the priority benefit of Korean application no. 10-2016-0083620, filed on Jul. 1, 2016. The entirety of each of the abovementioned patent applications is hereby incorporated by reference herein and made a part of this specification.

TECHNICAL FIELD

Following exemplary embodiments relate to a two-dimensional semiconductor in which an energy band gap changes with a thickness, a manufacturing method therefor, and a semiconductor device including the same.

BACKGROUND ART

A contact structure of a metal and a semiconductor in which a voltage-current characteristic has a rectifying property, that is, current easily flows at a voltage in an arbitrary direction but current hardly flows at a voltage in a reverse direction is referred to as a Schottky junction. A direction of the voltage at which the current easily flows is referred to as a forward direction and a direction of the voltage at which the current hardly flows is referred to as a reverse direction.

The Schottky junction has a rectifying property because a potential barrier is formed at the junction due to different functions of the metal and the semiconductor. For example, when a function of the metal is higher than that of the semiconductor at a junction of a metal and an n-type semiconductor, a potential barrier for electrons is formed at the junction to become a Schottky junction. When a positive voltage is applied from the metal to the semiconductor at this junction, the potential barrier is lowered and electrons in the n-type semiconductor flow to the metal so that current flows.

When the voltage is applied in a reverse direction, the potential barrier becomes higher, so that the flow of the electrons from the metal to the semiconductor is blocked and the current hardly flows. When the function of the metal is lower than that of the n-type semiconductor, the potential barrier for electrons is not formed so that the Schottky junction is not formed. Further, when the function of the metal is lower than that of a P-type semiconductor at the junction of the P-type semiconductor and the metal, the potential barrier for holes is formed to become a Schottky junction.

In order to control the Schottky junction according to the related art, an additional process is required to vary the type of metal or semiconductors.

DISCLOSURE

Technical Problem

Exemplary embodiments may provide a technology which forms a Schottky junction having various barrier thicknesses from an ohmic junction by a junction of the metal and one type of two-dimensional semiconductor having a characteristic in which an energy band gap changes with a thickness.

Further, exemplary embodiments may provide a technology of manufacturing a semiconductor device having various structures using a two-dimensional semiconductor in which characteristics vary by changing the thickness.

Technical Solution

According to an exemplary embodiment, a two-dimensional semiconductor includes a first layer formed with a first thickness and a second layer formed with a second thickness, the first thickness and the second thickness may be different from each other and the first layer may form a first junction with a first electrode and the second layer may form a second junction with a second electrode.

The two-dimensional semiconductor may be at least one of tungsten disulfide, transition metal dichalcogenides (TMDs), and black phosphorus.

The first junction may be any one of a Schottky junction and an ohmic junction and the second junction may be any one of a Schottky junction and an ohmic junction.

The transition metal dichalcogenides may include at least one of $WSe_2$, $WTe_2$, $MoS_2$, $MoSe_2$, and $MoTe_2$.

The first layer and the second layer may be formed to have different thicknesses by way of at least one of a semiconductor growth method, a thermal etching method, a chemical etching method, and a laser etching method.

According to an exemplary embodiment, a manufacturing method of a two-dimensional semiconductor includes: forming a first layer having a first thickness; and forming a second layer having a second thickness in which the first thickness and the second thickness are different from each other and the first layer forms a first junction with a first electrode and the second layer forms a second junction with a second electrode.

The two-dimensional semiconductor may include at least one of tungsten disulfide, transition metal dichalcogenides (TMDs), and black phosphorus.

The first junction may be any one of a Schottky junction and an ohmic junction and the second junction may be any one of a Schottky junction and an ohmic junction.

The transition metal dichalcogenides may include at least one of $WSe_2$, $WTe_2$, $MoS_2$, $MoSe_2$, and $MoTe_2$.

The first layer and the second layer may be formed to have different thicknesses by way of at least one of a semiconductor growth method, a thermal etching method, a chemical etching method, and a laser etching method.

According to an exemplary embodiment, a semiconductor device includes: a two-dimensional semiconductor including a first layer having a first thickness and a second layer having a second thickness, a first electrode which forms a first junction with the first layer, and a second electrode which forms a second junction with the second layer, in which the first thickness and the second thickness are different from each other.

The first junction may be a Schottky junction and the second junction may be an ohmic junction.

The second thickness may be larger than the first thickness.

The semiconductor device may be a diode.

DESCRIPTION OF DRAWINGS

FIG. 1 is a graph for explaining a characteristic of a two-dimensional semiconductor according to an exemplary embodiment.

FIG. 2 is a schematic diagram of a two-dimensional semiconductor according to an exemplary embodiment.

FIG. 3 is an example of a semiconductor device using a two-dimensional semiconductor according to an exemplary embodiment.

FIG. 4 is a view for explaining an energy diagram of a semiconductor device illustrated in FIG. 3.

FIG. 5A is an example in which a diode which is an example of a semiconductor device illustrated in FIG. 3 is actually implemented using tungsten disulfide as an example of a two-dimensional semiconductor.

FIG. 5B is a graph for explaining an operation of a diode which is actually implemented in FIG. 5A.

FIG. 6 is a flowchart for explaining a forming method of a two-dimensional semiconductor illustrated in FIG. 2.

BEST MODE

Specific structural or functional descriptions of exemplary embodiments in accordance with a concept of the present invention which are disclosed in this specification are illustrated only to describe the exemplary embodiments in accordance with the concept of the present invention and the exemplary embodiments in accordance with the concept of the present invention may be carried out by various forms but are not limited to the exemplary embodiments described in this specification.

Various modifications and changes may be applied to the exemplary embodiments in accordance with the concept of the present invention so that the exemplary embodiments will be illustrated in the drawings and described in detail in the specification. However, the invention is not limited to the specific embodiments, but includes all changes, equivalents, or alternatives which are included in the spirit and technical scope of the present invention.

Terminologies such as first or second may be used to describe various components but the components are not limited by the above terminologies. The above terminologies are used to distinguish one component from the other component, for example, a first component may be referred to as a second component without departing from a scope in accordance with the concept of the present invention and similarly, a second component may be referred to as a first component.

It should be understood that, when it is described that an element is "coupled" or "connected" to another element, the element may be "coupled" or "connected" to the another element or "coupled" or "connected" to the another element through a third element. In contrast, when it is described that an element is "directly coupled" or "directly connected" to another element, it should be understood that no element is present therebetween. Other expressions which describe the relationship between components, that is, "between" and "directly between", or "adjacent to" and "directly adjacent to" need to be interpreted by the same manner.

Terms used in the present application are used only to describe specific exemplary embodiments, and are not intended to limit the present invention. A singular form may include a plural form if there is no clearly opposite meaning in the context. In the present specification, it should be understood that term "include" or "have" indicates that a feature, a number, a step, an operation, a component, a part or the combination thoseof described in the specification is present, but does not exclude a possibility of presence or addition of one or more other features, numbers, steps, operations, components, parts or combinations, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if they are not clearly defined in this specification.

Hereinafter, exemplary embodiments will be described in detail with reference to the accompanying drawings. However, the scope of the patent application will not be limited or restricted to embodiments below. In each of the drawings, like reference numerals denote like elements.

FIG. 1 is a graph for explaining a characteristic of a two-dimensional semiconductor according to an exemplary embodiment.

Referring to FIG. 1, when a two-dimensional semiconductor 100 is tungsten disulfide, a thickness of a Schottky barrier in accordance with the number of layers of tungsten disulfide is illustrated. In this case, the layers may have the same thickness.

In FIG. 1, a graph illustrates an example in which the two-dimensional semiconductor 100 is tungsten disulfide, but it is not limited thereto and the two-dimensional semiconductor 100 may be all two-dimensional semiconductors. For example, the two-dimensional semiconductor 100 may include transition metal dichalcogenides (TMDs) or black phosphorus. The transition metal dichalcogenides may include $WSe_2$, $WTe_2$, $MoS_2$, $MoSe_2$, and $MoTe_2$.

The following description may be applied to all two-dimensional semiconductors.

The two-dimensional semiconductor 100 may have a characteristic (or a property) that an energy band gap varies depending on the number of layers, that is, the thickness. As illustrated in FIG. 1, a thickness of the Schottky barrier formed by the junction of the two-dimensional semiconductor 100 and the metal (or a metal layer) may be controlled according to the thickness of the two-dimensional semiconductor 100.

That is, the two-dimensional semiconductor 100 may form various junctions with metal by varying the thickness. For example, the two-dimensional semiconductor 100 may form not only an ohmic junction, but also Schottky junctions having various barrier thicknesses, as the junction with metal.

A thickness of a Schottky barrier which is initially generated is determined by adjusting the thickness of the two-dimensional semiconductor 100 to implement a device performance used at various locations.

FIG. 2 is a schematic diagram of a two-dimensional semiconductor according to an exemplary embodiment.

Referring to FIG. 2, the two-dimensional semiconductor 100 may include a first layer 110 and a second layer 130. The two-dimensional semiconductor 100 may be a two-dimensional semiconductor which includes at least one of tungsten disulfide, transition metal dichalcogenides (TMDs), and black phosphorus.

The first layer 110 is formed to have a first thickness L1 and the second layer 130 is formed to have a second thickness L2. The first thickness L1 and the second thickness L2 may be different from each other. As illustrated in FIG. 2, any one layer of the two-dimensional semiconductor 100, for example, the second layer 130 may be formed to be bulkier than the first layer 110.

For example, the first layer 110 and the second layer 130 may be formed to have different thicknesses by way of at least one of a semiconductor growth method, a thermal etching method, a chemical etching method, and a laser etching method.

The first layer 110 may form a first junction with a first electrode (not illustrated). The first junction may be any one of the Schottky junction and the ohmic junction.

The second layer 130 may form a second junction with a second electrode (not illustrated). The second junction may be any one of the Schottky junction and the ohmic junction.

The first electrode and the second electrode may be formed of the same metal (or metal layer) or may be formed of different metals.

One kind of two-dimensional semiconductor 100 is formed by varying the thicknesses of the first layer 110 and the second layer 130 so that the junction of the two-dimensional semiconductor 100 with an electrode may be controlled. Therefore, a cost used for an additional process for a junction may be saved.

Further, the two-dimensional semiconductor 100 provides an additional degree of freedom in thickness to manufacture a semiconductor device, so that semiconductor devices having various structures may be manufactured. Hereinafter, a semiconductor device using a two-dimensional device 100 will be described.

FIG. 3 is an example of a semiconductor device using a two-dimensional semiconductor according to an exemplary embodiment and FIG. 4 is a view for explaining an energy diagram of a semiconductor device illustrated in FIG. 3.

Referring to FIGS. 3 and 4, a semiconductor device 300 may include a two-dimensional semiconductor 200, a first electrode 310, and a second electrode 330. For example, the semiconductor device 300 may be a diode.

The two-dimensional semiconductor 200 of FIG. 3 may be an example of the two-dimensional semiconductor 100 of FIGS. 1 and 2. The two-dimensional semiconductor 200 may include a first layer 210 formed to have a first thickness L3 and a second 230 formed to have a second thickness L4. The first thickness L3 and the second thickness L4 may be different from each other.

The first layer 210 forms a first junction with the first electrode 310 and the second layer 230 forms a second junction with the second electrode 330. For example, the first electrode 310 may be a drain electrode and the second electrode 330 may be a source electrode.

The first junction formed between the first layer 210 and the first electrode 310 which is a drain electrode may be a Schottky junction and the second junction formed between the second layer 230 and the second electrode 330 which is a source electrode may be an ohmic junction.

In this case, the second thickness L4 may be larger than the first thickness L3.

As illustrated in FIG. 4, when a forward bias (for example, $V_D$>0) is input, the current may easily flow because there is no barrier which hinders movement of electrons (that is, a resistance is low) and when a reverse bias (for example, $V_D$<0) is input, the current may not flow because there is a barrier which hinders the movement of the electrons.

The semiconductor device 300 may be effectively implemented as a diode using a single two-dimensional semiconductor 200 having different thicknesses. Further, when the single two-dimensional semiconductor 200 is tungsten disulfide, the semiconductor device 300 may be implemented as a transparent device and a flexible device (for example, a wearable device).

FIG. 5A is an example in which a diode which is an example of a semiconductor device illustrated in FIG. 3 is actually implemented using tungsten disulfide as an example of a two-dimensional semiconductor and FIG. 5B is a graph for explaining an operation of a diode which is actually implemented in FIG. 5A.

Referring to FIGS. 5A and 5B, a diode 500 of FIG. 5A is an example which actually implements a diode which is an example of the semiconductor device 300 of FIG. 3 using tungsten disulfide.

The first layer 210 of FIG. 3 may correspond to a layer 510 of FIG. 5A and the second layer 230 of FIG. 3 may correspond to a layer 530 of FIG. 5A. As illustrated in FIG. 5A, the layer 510 and the layer 530 may be formed by varying the thickness of tungsten disulfide. For example, the layer 510 is formed by one layer of tungsten disulfide and the layer 530 is formed by five layers of tungsten disulfide.

Therefore, a diode 500 may be implemented such that the layer 510 and the layer 530 form different junctions with metal.

As described with reference to FIGS. 3 and 4, an operation of the diode 500 is as illustrated in FIG. 5B. When a forward bias (for example, $V_{ds}$>0) is input, the current may easily flow because there is no barrier which hinders movement of electrons (that is, a resistance is low) and when a reverse bias (for example, $V_{ds}$<0) is input, the current may not flow because there is a barrier which hinders the movement of the electrons.

The semiconductor device 500 may be effectively implemented as a diode using single tungsten disulfide having different thicknesses.

FIG. 6 is a flowchart for explaining a forming method of a two-dimensional semiconductor illustrated in FIG. 2.

Referring to FIGS. 1, 2, and 5, a first layer 110 with a first thickness L1 may be formed in step S910. A second layer 130 with a second thickness L2 may be formed in step S930. The first thickness L1 and the second thickness L2 may be different from each other.

The first layer 110 and the second layer 130 may be formed to have different thicknesses by way of at least one of a semiconductor growth method, a thermal etching method, a chemical etching method, and a laser etching method.

For example, the second layer 130 may be formed by further growing a two-dimensional semiconductor 100, for example, a material (a matter or a raw material) of the two-dimensional semiconductor 100 on the first layer 110 as much as a difference of the second thickness L2 and the first thickness L2.

As another example, the first layer 110 may be formed by further etching a two-dimensional semiconductor 100, for example, a material (or a raw material) of the two-dimensional semiconductor 100 from a predetermined portion of the second layer 130 as much as a difference of the second thickness L2 and the first thickness L2.

The device described above may be implemented by a hardware component, a software component, and/or a combination of the hardware component and the software component. For example, the device and the components described in the exemplary embodiments may be implemented, for example, using one or more general purpose computers or special purpose computers such as a processor, a controller, an arithmetic logic unit (ALU), a digital signal processor, a microcomputer, a field programmable gate array (FPGA), a programmable logic unit (PLU), a microprocessor, or any other device which executes or responds instructions. The exemplary embodiments may be implemented not only in a digital circuit, but also in an analog circuit, for example, various RF circuits such as an amplifying circuit, a filter circuit, an arithmetic circuit, an impedance matching circuit, a modulating circuit, a power circuit, and a high-frequency circuit. The processing device may perform an operating system (OS) and one or more software applications which are performed on the operating system. Further, the processing device may access, store, manipulate, process, and generate data in response to the execution of the software. For ease of understanding, it may be described that a single processing device is used, but those skilled in the art may understand that the processing device includes a plurality of processing elements and/or a plurality of types of processing element. For example, the processing device may include a plurality of processors or include one processor and one controller. Further, another processing configuration such as a parallel processor may be allowed.

The software may include a computer program, a code, an instruction, or a combination of one or more of them and configure the processing device to be operated as desired or independently or collectively command the processing device. The software and/or data may be permanently or temporarily embodied in an arbitrary type of machine, component, physical device, virtual equipment, computer storage medium, or device, or signal wave to be transmitted to be interpreted by a processing device or provide command or data to the processing device. The software may be distributed on a computer system connected through a network to be stored or executed in a distributed manner. The software and data may be stored in one or more computer-readable recording media.

The method according to the exemplary embodiment may be implemented as a program command which may be executed by various computers to be recorded in a computer-readable medium. The computer-readable medium may include solely a program command, a data file, and a data structure or a combination thereof. The program command recorded in the medium may be specifically designed or constructed for the exemplary embodiment or known to those skilled in the art of computer software to be used. An example of the computer-readable recording medium includes a magnetic media, such as a hard disk, a floppy disk, and a magnetic tape, an optical media, such as a CD-ROM and a DVD, a magneto-optical media, such as a floptical disk, and a hardware device, such as a ROM, a RAM, a flash memory, specially formed to store and execute a program command. Examples of the program command include not only a machine language code which is created by a compiler but also a high-level language code which may be executed by a computer using an interpreter. The hardware device may operate as one or more software modules in order to perform the operation of the exemplary embodiment and vice versa.

Although the exemplary embodiments have been described above by a limited example and the drawings, various modifications and changes can be made from the above description by those skilled in the art. For example, even when the above-described techniques are performed by different order from the described method and/or components such as the system, the structure, the device, and the circuit described above are coupled or combined in a different manner from the described method or replaced or substituted with other components or equivalents, the appropriate results can be achieved.

Therefore, other implements, other embodiments, and equivalents to the claims are within the scope of the following claims.

The invention claimed is:

1. A two-dimensional semiconductor, comprising:
a first layer formed with a first thickness; and
a second layer formed with a second thickness,
wherein the first layer and the second layer are formed of a same two-dimensional semiconductor material, the first thickness and the second thickness are different from each other and the first layer forms a first junction with a first electrode and the second layer forms a second junction with a second electrode, and
wherein the first junction and the second junction are different from each other by a Schottky barrier height by engineering a thickness difference between the first layer and the second layer.

2. The two-dimensional semiconductor of claim 1, wherein the two-dimensional semiconductor is at least one of tungsten disulfide, transition metal dichalcogenides (TMDs), and black phosphorus.

3. The two-dimensional semiconductor of claim 2, wherein the transition metal dichalcogenides include at least one of $WSe_2$, $WTe_2$, $MoS_2$, $MoSe_2$, and $MoTe_2$.

4. The two-dimensional semiconductor of claim 1, wherein the first junction is a Schottky junction and the second junction is an ohmic junction.

5. The two-dimensional semiconductor of claim 1, wherein the first layer and the second layer are formed to have different thicknesses by way of at least one of a semiconductor growth method, a thermal etching method, a chemical etching method, and a laser etching method.

6. A manufacturing method of a two-dimensional semiconductor, comprising:
forming a first layer having a first thickness; and
forming a second layer having a second thickness,
wherein the first layer and the second layer are formed of a same two-dimensional semiconductor material, the first thickness and the second thickness are different from each other and the first layer forms a first junction with a first electrode and the second layer forms a second junction with a second electrode, and
wherein the first junction and the second junction are different from each other by a Schottky barrier height by engineering a thickness difference between the first layer and the second layer.

7. The manufacturing method of claim 6, wherein the two-dimensional semiconductor includes at least one of tungsten disulfide, transition metal dichalcogenides (TMDs), and black phosphorus.

8. The two-dimensional semiconductor of claim 7, wherein the transition metal dichalcogenides include at least one of $WSe_2$, $WTe_2$, $MoS_2$, $MoSe_2$, and $MoTe_2$.

9. The manufacturing method of claim 6, wherein the first junction is any one of a Schottky junction and an ohmic junction and the second junction is any one of a Schottky junction and an ohmic junction.

10. The two-dimensional semiconductor of claim 6, wherein the first layer and the second layer are formed to have different thicknesses by way of at least one of a semiconductor growth method, a thermal etching method, a chemical etching method, and a laser etching method.

11. A semiconductor device, comprising:
a two-dimensional semiconductor including a first layer having a first thickness and a second layer having a second thickness;
a first electrode which forms a first junction with the first layer; and
a second electrode which forms a second junction with the second layer, wherein the first thickness and the second thickness are different from each other and the first layer and the second layer are formed of a same two-dimensional semiconductor material, wherein the first junction and the second junction are different from each other by a thickness difference between the first layer and the second layer.

12. The semiconductor device of claim 11, wherein the first junction is a Schottky junction and the second junction is an ohmic junction.

13. The semiconductor device of claim 12, wherein the second thickness is larger than the first thickness.

14. The semiconductor device of claim 11, wherein the semiconductor device is a diode.

* * * * *